United States Patent [19]

Asmussen et al.

[11] Patent Number: 4,581,401

[45] Date of Patent: Apr. 8, 1986

[54] RADIATION SENSITIVE POLYMERIC MATERIAL

[75] Inventors: Frithjof Asmussen, Berlin; Peter Qüis, Darmstadt; Winfried Wunderlich, Rossdorf; Wolfram Schnabel; Hideto Sotobayashi, both of Berlin, all of Fed. Rep. of Germany

[73] Assignee: Röhm GmbH, Darmstadt, Fed. Rep. of Germany

[21] Appl. No.: 652,449

[22] Filed: Sep. 19, 1984

[30] Foreign Application Priority Data

Sep. 20, 1983 [DE] Fed. Rep. of Germany ....... 3333861

[51] Int. Cl.$^4$ ................................................ C08F 8/34
[52] U.S. Cl. .................................... 524/302; 522/118; 427/36; 427/38; 524/303; 524/392; 430/286; 430/325
[58] Field of Search ............... 524/392, 302, 303, 304, 524/305, 750; 526/224

[56] References Cited

U.S. PATENT DOCUMENTS

| | | | |
|---|---|---|---|
| 3,257,340 | 6/1966 | Osmond | 524/750 |
| 3,772,258 | 11/1973 | Lachowicz | 526/224 |
| 3,978,022 | 8/1976 | Carson | 524/392 |
| 4,152,506 | 5/1979 | Novak | 526/224 |
| 4,246,382 | 1/1981 | Honda | 526/224 |
| 4,289,842 | 9/1981 | Tan et al. | 430/270 |

OTHER PUBLICATIONS

Chem. Abstracts, 94, 165698n.
Taylor et al., J. Electrochem. Soc., 127, 2665–2674 (1980).

*Primary Examiner*—Paul R. Michl
*Attorney, Agent, or Firm*—Curtis, Morris & Safford

[57] ABSTRACT

A radiation sensitive polymeric material comprising a copolymer of methyl methacrylate and allyl methacrylate and at least one organosulfur compound having at least two —SH groups per molecule, said material being useful as a polymer resist sensitive to high energy radiation.

12 Claims, 1 Drawing Figure

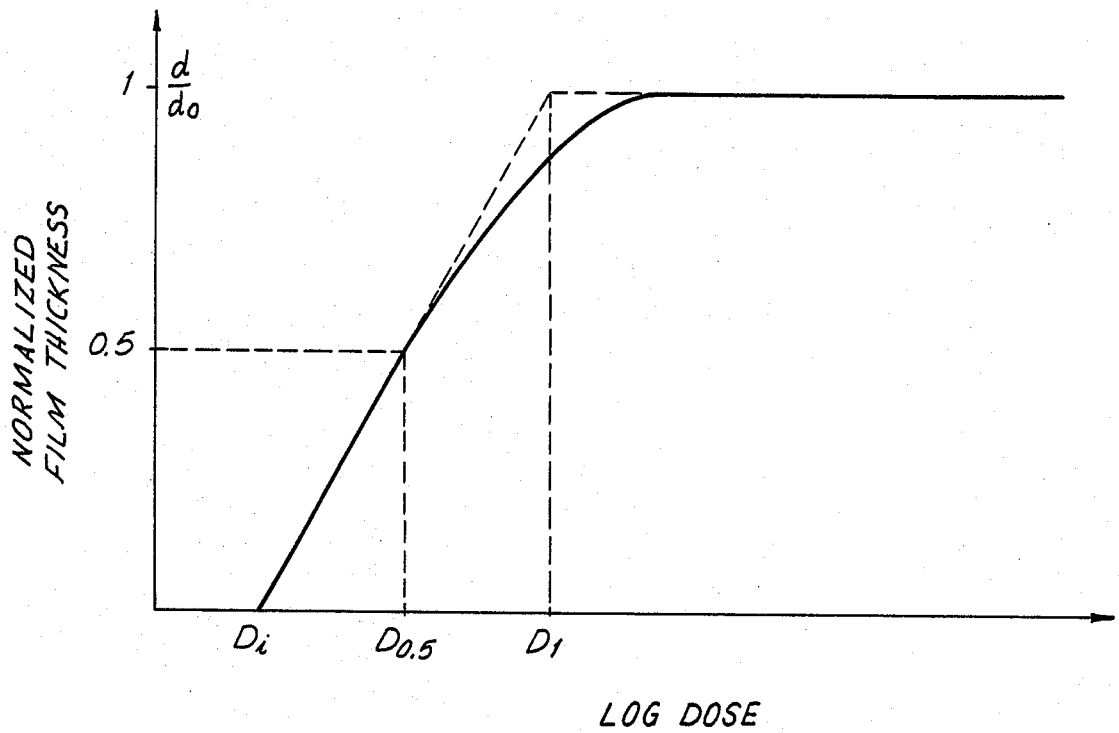

RADIATION SENSITIVE POLYMERIC MATERIAL

The present invention relates to a radiation sensitive polymeric material comprising an acrylic resin.

Radiation sensitive polymers have been used in the art as so-called polymer resists for the recording of information. Such polymer resists can be used to fabricate semiconductor devices, for example. Through exposure to high energy radiation (electrons, photons, X-rays), zones of modified solubility can be created in relatively thin polymer layers in the submicron range with high precision. The solubility of the polymer in specific solvents can be increased (positive resists) or reduced (negative resists) by the radiation. An increase in the solubility of the polymeric material is believed to be due essentially to depolymerization, while a reduction in solubility is due to crosslinking.

Polymethyl methacrylate, for example, may be regarded as a standard for radiation sensitive polymeric materials (polymer resists). Polymers with reduced solubility (negative resists) often contain crosslinkable units. For example, copolymers of glycidyl methacrylate and ethyl acrylate are described as polymer resists in J. Vac. Sci. Technol. 15, (3) 960-64 (1979).

It is known from Japanese patent publication No. 55,133,035 (Chem. Abstr. 94: 165698n) that a polymer composed of methyl methacrylate and, preferably, from 1 to 60 mole percent of allyl methacrylate can be used as an electron beam resist. According to this Japanese patent publication, the polymers are prepared by the reaction of a methacrylic chloride/methyl methacrylate copolymer with allyl alcohol. A copolymer having from 5 to 60 mole percent allyl methacrylate is suitable for use as negative resist and as positive resist, a copolymer having from 1 to 5 mole percent of allyl methacrylate is used.

In U.S. Pat. No. 4,289,842, copolymers of acrylic esters having a terminal double bond with acrylic esters or amides having a terminal hydroxyl group in the ester portion or amide portion are proposed as electron beam resists. For example, copolymers of allyl methacrylate and 2-hydroxyethyl methacrylate in a ratio of 75:25 are described and are compared with a polyallyl methacrylate/ethyl methacrylate copolymer according to U.S. Pat. No. 3,376,138. A further comparison is made with copolymers of methyl methacrylate and 2-hydroxyethyl methacrylate.

Moreover, in published German patent application No. DOS 23 36 517 a resist material for electron-beam recording is disclosed which consists of a linear polymer comprising an acrylate or methacrylate with side chains having from 3 to 20 carbon atoms and carrying a terminal polymerizable double bond. These units carrying terminal polymerizable double bonds are introduced by reaction of a suitable monomer with, for example, polymers having terminal hydroxyl, amino, or carboxyl groups in the side chain.

Such reactions in which one of the reagents is a polymer (known as "polymer analogous reactions") ab initio technically represent less attractive routes to the production of resists.

The number of patents and patent applications which seek to show improved properties, and particularly enhanced sensitivity, in polymer resists through modification of the polymers is quite large.

To be suitable for use as resist materials, polymers must meet a number of requirements. These include high sensitivity or acceptably short exposure times, for example. During development (dissolution, by means of appropriate solvents, of the portions to be removed), the polymeric materials, usually present as a thin layer on the surface of the substrate, must not tend to deform or lift off. Another requirement is thermal stability. These properties should be present in the thin polymer films having a thickness between 0.1 and 1 micron, and more particularly between $0.5\pm0.2$ micron, which is usually required.

Of primary interest to the present invention is the suitability of a polymeric material for use as negative X-ray resist which is developable not only in organic solvents but, after alteration, also in an oxygen plasma. The minimum sensitivity for treatment with soft X-rays should be 100 mJ/cm$^2$. Synchrotron radiation is particularly well suited for large area replication of submicrostructures through specified masks. For electron beam treatment, the minimum sensitivity should be $10^{-6}$ C/cm$^2$. In addition, a good resolution is desirable when the film is exposed to radiation.

The subtrate materials for the semiconductor devices (semiconductor wafers) which are of primary interest are mainly silicon (silicon wafers), chromium clad glass, and metals such as aluminum.

The molecular weight of the polymers should not be too high so that solution coating may be employed. On the other hand, low molecular weights tend to reduce the sensitivity of the polymers to radiation. U.S. Pat. No. 4,289,842 gives molecular weights (as determined by gel permeation chromatography) between 40,000 and 50,000, while Japanese patent publication No. 55-133,035 refers to average molecular weights between $10^3$ and $3\times10^6$, and generally between $10^4$ and $10^6$.

In several respects, the prior art resists have not proved fully satisfactory. For example, it should be possible to produce the polymers by free radical polymerization from the monomers, in other words without a subsequent polymer analogous reaction.

Technical requirements are largely met by the polymeric acrylate resin compositions of the present invention in which an organosulfur compound having at least two -SH groups per molecule is present during exposure of the composition to high energy radiation.

FIG. 1 is a plot of film thickness versus radiation dose from which certain properties (sensitivity, contrast factor) characteristic of resist films like those of the invention can be evaluated for purposes of comparison.

As a rule, the organosulfur modifers in accordance with the invention contain at least 4, and preferably 6, but generally not more than 40 carbon atoms per molecule. The presence in the molecule of one or, preferably, more ω-mercaptocarboxylic esters, for example, preferably derived from polyols such as glycol, propanediol, glycerol, or pentaerythritol, for example, is of advantage.

Organosulfur modifiers with at least two -SH groups per molecule may be represented to some extent by the formula

wherein A is an alkylene group having from 3 to 16 carbon atoms, and more particularly an alkylene group having from 4 to 8 carbon atoms, or is a

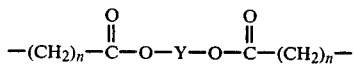

group wherein n is 0 or an integer from 1 to 8, and more particularly 0 or 1 to 5, and Y is an alkylene group having from 2 to 16 carbon atoms which may be optionally substituted by

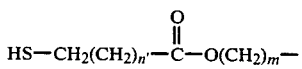

units, wherein n' has the same meaning as n, and m is 0 or an integer from 1 to 8.

Organosulfur compounds which are particularly well suited for use in accordance with the invention are ethylene glycol dithioglycolate, pentaerythritol tetrathioglycolate, pentaerythritol tetra-ε-mercaptocaproic esters and ε-mercaptopropionic esters, 1,6-dimercaptohexane, 1,9-dimercaptononane, and the like.

In accordance with the invention, the organosulfur compounds having at least two -SH groups per molecule are used in concentrations from 0.5 to 15 percent, and preferably from 1 to 10 percent, and more particularly of 6±1 percent, by weight, of the methyl methacrylate/allyl methacrylate copolymer present.

The presence of the organosulfur compounds with at least two -SH groups (hereinafter called "organosulfur modifiers") during exposure to radiation is decisive for the advantages exhibited by the radiation sensitive material of the invention when used as an electron resist or photoresist, and particularly as an X-ray resist.

The organosulfur modifers should be randomly distributed in the polymeric material. In principle, it will therefore suffice to add the organosulfur modifiers to the finished methyl methacrylate/allyl methacrylate copolymer just before it is exposed to radiation. However, such addition may also be effected at any other time between the completed preparation of the methyl methacrylate/allyl methacrylate copolymer and its use, although it should be borne in mind that the material may react prematurely under the action of oxygen and light.

The organosulfur modifers may be incorporated into the methyl methacrylate/allyl methacrylate copolymers conventionally, preferably during the preparation of the coating solution. Care should be taken to assure uniform distribution.

In contrast to the prior art, the methyl methacrylate/allyl methacrylate copolymers are produced, not by polymer analogous reactions, but by polymerization of the monomers methyl methacrylate and allyl methacrylate under appropriate conditions.

The amount of the methyl methacrylate/allyl methacrylate copolymer represented by allyl methacrylate usually ranges from 10 to 60 percent, and preferably ranges from 30 to 50 percent, by weight, of the total polymer. The molecular weight of the copolymers preferably is between $10^4$ and $10^5$, and more particularly between 10,000 and 80,000, and most preferably between 30,000 and 70,000. The molecular weight may be determined conventionally by gel permeation chromatography (GPC).

As a rule, the inhomogeneity of the copolymers should not exceed a value of 10. (The inhomogeneity is defined as the quotient of the weight average molecular weight and the number average molecular weight).

Copolymers of methyl methacrylate and allyl methacrylate usually are very well suited for use as resists without the addition of further comonomers. However, monomers other than methyl methacrylate and allyl methacrylate, for example optionally substituted alkyl acrylates or methacrylates having from 1 to 7 carbon atoms in the alkyl group, such as isopropyl, n-butyl, sec-butyl, tert-butyl, cyclohexyl and benzyl acrylates or methacrylate ("type A" comonomers), may be copolymerized with them in amounts from 0 to 10 percent, by weight of total monomers.

For plasma etching, copolymerization with monomers having aromatically substituted side chains will be of advantage. For example, esters of acrylic or methacrylic acid with aromatic alcohols or phenols, such as the acrylate or methacrylate esters of naphthol, phenol, benzyl alcohol, etc., are suitable for this purpose, as well as aromatic vinyl monomers such as vinylcarbazole ("type B" comonomers). In the case of copolymers particularly well suited for plasma etching, the amount of said aromatic comonomers of type B may represent up to 30 weight percent, and preferably from 5 to 30 weight percent, of the total monomers. When type B comonomers are present, the type A comonomers can usually be dispensed with.

For improved adhesion, particularly to metallic surfaces, adhesion promoting comonomers such as compounds capable of free-radical polymerization and containing carboxyl groups, hydroxyl groups, and/or nitrogen bearing groups ("type C" comonomers) may furthermore be used. Illustrative of these are acrylic acid and/or methacrylic acid; hydroxyalkyl acrylates or methacrylates such as β-hydroxyethyl methacrylate; acrylamide and/or methacrylamide; and the dialkylamino esters or amides of acrylic acid or methacrylic acid, for example the diethylaminoethyl ester of methacrylic acid and the diethylaminoethylamide of acrylic or methacrylic acid. The type C monomers containing functional, adhesion promoting groups usually represent from 0 to 5 weight percent of the total monomers. The type C monomers may be incorporated into the methyl methacrylate/allyl methacrylate copolymers either as the only other comonomers or together with type A or type B comonomers.

The copolymers are preferably prepared by free radical bulk polymerization. The polymerization temperature should be kept below about 70° C. whenever possible to avoid premature crosslinking reactions. Suitable initiators are conventional initiators decomposing at low temperature, for example those of the peroxide or azo type, such as lauroyl peroxide or azoisobutyronitrile, used in the usual concentrations of about 0.05 to 0.5 percent, by weight of the monomers, with 0.25 weight percent serving as a guide.

The molecular weight modifiers or chain transfer agents used are preferably organosulfur modifiers, and primarily monofunctional organosulfur modifiers such as lauryl mercaptan or esters of thioglycolic acid, for example 2-ethylhexylthioglycolate. These modifiers should be used in relatively high concentrations, an appropriate range being 1 to 8 percent, and preferably 4 to 6 percent, by weight of the monomers, the modifer content being increased with the allyl methacrylate.

The polymerization will usually be carried out at a temperature of 50° C.±10° C.

Carrying out the polymerization in film bags made of cellophane or composite plastic sheeting as outlined in Belgian Pat. No. 695,342, for example, has been found to be particularly advantageous. The polymerization time may vary within certain limits. As a rule, the polymerization time will range from 40 to 70 hours.

Following polymerization, the material may be milled conventionally, for example in a hammer or pin mill.

In accordance with the invention, the radiation sensitive polymeric material (polymer resist) serves for replication of submicrostructures by means of high energy radiation, and particularly of soft X-rays, synchrotron radiation representing the optimum radiation because of its high intensity (exposure times of a few seconds), advantageous wavelength ($\lambda p \cong 1$ nm), and good collimation. The usual materials are suitable for use as substrates, i.e. in the case of semiconductor applications, silicon wafers, chromium clad glass, metals such as aluminum, etc., in standard sizes.

The resist material can be applied conventionally, for example from a solution of the copolymers.

Suitable solvents are esters such as butyl acetate, ketones such as methyl isobutyl ketone, and aromatic hydrocarbons such as chlorobenzene, for example.

The coating of the substrate is usually carried out by the spin coating method. The coating is then advantageously dried. For film formation, a prebake temperature which is above the glass transition temperature should be chosen. This prebake temperature, which should be maintained for 15 to 30 minutes, preferably ranges from 120° C. to 150° C.

The thickness of the polymer layer deposited generally should not exceed 1 micron. As a rule, it will range from 0.1 to 1 micron and preferably is 0.5±0.2 micron. The radiation sensitive polymeric materials of the invention are intended primarily for use as negative working resists. As pointed out earlier, with negative working resists solubility in given solvents is reduced upon radiation. In the "development" and "etching" with solvents which then follow, the unexposed and therefore unaltered areas of the layer are removed by the solvent, whereas the exposed and therefore altered areas are not dissolved and remain intact on the substrate.

Suitable solvents for this purpose are solvents or solvent/precipitant mixtures which per se have low solvent power. Illustrative of these are ketones, for example methyl ethyl ketone and particularly methyl isobutyl ketone, optionally in admixture with alcohols such as ethanol or isopropanol, alcohols such as 2-ethoxyethanol; and chlorinated hydrocarbons from $C_2$, such as $C_2$ to $C_4$, and especially n-butyl chloride.

Alternatively, development may be carried out in the dry state in an oxygen plasma. To this end, a procedure similar to that proposed by Taylor in J. Electrochem. Soc. 127, 2665 (1980) for poly(2,3-dichloro-1-propyl acrylate) is employed. About 20 percent of monomeric N-vinylcarbazole is added to the coating solution and, in the case of the copolymers of methyl methacrylate and allyl methacrylate here described, in contrast to Taylor from 2 to 8 percent of pentaerythritol tetrathioglycolate (PTT) is added as a crosslinking agent. The spun on coating film is carefully dried at about 80° C. Exposure to synchrotron radiation initiates a crosslinking reaction with incorporation of the etch resistant N-vinylcarbazole. In a fixation step which follows, the monomeric N-vinylcarbazole in the unexposed areas is removed at about 150° C. under vacuum.

Dry development of the resist in an oxygen plasma (pressure=0.7 millibar; high frequency power=100 watts) occurs through oxidative decomposition of the unexposed areas. The exposed areas containing poly-N-vinylcarbazole are more resistant to oxygen plasma than the polymer systems described by Taylor.

The radiation sensitive polymer material (polymer resist) of the invention is distinguished by a very high sensitivity. Sensitivities are obtained which are higher by a factor of 50 than those of poly(methyl methacrylate), which is generally used as a positive working resist.

The methyl methacrylate/allyl methacrylate copolymers suitable for use in accordance with the invention can generally be produced by the procedure set forth in Example 1 which follows.

All percentages given are in percent by weight.

EXAMPLE 1—PREPARATION OF A METHYL METHACRYLATE/ALLYL METHACRYLATE COPOLYMER (60:40)

60 percent of methyl methacrylate and 40 percent of allyl methacrylate to which have been added 0.2 percent of dilauroyl peroxide as an initiator and 6 percent of dodecyl mercaptan (DDM) as molecular weight regulator (both based on the weight of the monomers) are polymerized in a bag made of plastic sheeting for 63 hours at a temperature of 52° C. in a water bath. With an inhomogeneity (Mw/Mn-1) of 4.5, the molecular weight (Mw) is 24,000.

The polymers of Examples 2 to 7 listed in Table 1 can be prepared by the same procedure as that of Example 1.

TABLE 1

| Example No. | Proportion of (%) | | | | Modifier (%) | Molecular Weight | |
|---|---|---|---|---|---|---|---|
| | MMA | AMA | DEMA | BMA | DDM | (Mw) | Inhomogeneity |
| 2 | 80 | 20 | — | — | 5 | 16,000 | 2.0 |
| 3 | 70 | 30 | — | — | 6 | 13,000 | 2.0 |
| 4 | 70 | 30 | — | — | — | 64,000 | — |
| 5 | 50 | 50 | — | — | — | 53,000 | — |
| 6 | 60 | 30 | — | 10 | 5.5 | 25,800 | 3.1 |
| 7 | 77 | 20 | 3 | — | 6 | 14,000 | 1.89 |

Key to abbreviations:
MMA = Methyl methacrylate
AMA = Allyl methacrylate
DEMA = 2-Dimethylaminoethyl methacrylate
BMA = Benzyl methacrylate
DDM = Dodecyl mercaptan

TEST FOR SUITABILITY FOR USE AS X-RAY RESISTS

Test procedure:

(a) The polymers prepared in accordance with Examples 1 to 7 are dissolved in butyl acetate (content, about 15%) and the organosulfur modifier with at least two -SH groups per molecule is added with stirring (6% of pentaerythritol thioglycolate, based on the polymer). The controls are also prepared in the form of solutions but without an organosulfur modifier.

(b) A film from 0.8 to 1 micron thick is produced on the substrate (a semiconductor wafer) by spin coating.

(c) The substrate so coated is then dried for 15 minutes at 150° C. in a drying cabinet.

(d) The film is then exposed to synchrotron radiation of 10 to 1,000 mJ/cm².

(e) Then it is developed with methyl isobutyl ketone (optionally in admixture with propanol) for 15 to 30 seconds.

Evaluation is by interferometric measurement of the film thickness in the exposed area (d) and in the unexposed area by normalization based on the initial film thickness ($d_o$).

From the representation of the normalized film thickness $d/d_o$ as a function of the radiation dose D (logarithmic plot), a value can be derived for sensitivity (see FIG. 1), which is defined as follows: The sensitivity S is the radiation dose $D=D_{0.5}$ which corresponds to one-half the initial film thickness $d/d_o=\frac{1}{2}$.

Thus, the lower the radiation dose, the higher the sensitivity. Higher sensitivities are what is sought by the industry.

The results of this test are presented in Table 2.

EXAMPLE PROCEDURE FOR PLASMA DEVELOPMENT (a) A solution of 4 g allylmethacrylate copolymer (sample 7 in table 2), 1 g N-vinyl-carbazole monomer, 0,25 g pentaerythritol tetrathioglycolate in 20 g chlorobenzene is spun on a silicon wafer and dried at 80° C. The initial resist thickness is 1,28 μm.

(b) X-ray exposure: 70 mJ/cm²

(c) Fixation step: 150° C., vacuum, 1 h (d) The plasma development is carried out in a barrel reactor (HF-power: 100W) in $O_2$ plasma at a pressure of 0.75 torr.

(e) After a developing time of 29 min the unexposed area is completely removed. The remaining thickness of the exposed area is 0.69 μm. This corresponds to a normalized thickness of 0.54.

In comparison, for Taylor's resist (poly 2,3-dichloro-1-propylacrylate) the remaining normalized thickness is 0.31.

TABLE 2

Sensitivity and contrast of copolymers of methyl methacrylate (MMA) and allyl methacrylate (AMA). Crosslinking agent: Pentaerythritol thioglycolate (PTT). Radiation: Synchrotron radiation (Bessy), 780 MeV

| No. | MW | % AMA | % PTT | Prebake Temp. (°C.) | Prebake Time (min.) | Developer* %/% | Sensitivity (mJ/cm²) | Contrast (gamma)** | Developing Time (sec) |
|---|---|---|---|---|---|---|---|---|---|
| 1 | 16000 | 20 | 0 | 150 | 15 | Mi/P 70/30 | 100 | 0.66 | 15 |
|   |       |    | 2 | "   | "  | "          | 60  | 0.72 |    |
|   |       |    | 6 | "   | "  | "          | 50  | 1.02 |    |
| 2 | 21000 | 20 | 0 | 150 | 15 | Mi/P 70/30 | 230 | 2.1  | 15 |
|   |       |    | 2 | "   | "  | "          | 160 | 2.2  |    |
|   |       |    | 4 | "   | "  | "          | 88  | 1.4  |    |
| 3 | 1400  | 20 | 0 | 160 | 15 | Mi 100     | 150 | 2.2  | 15 |
|   |       |    | 2 | 160 | "  | "          | 96  | 2.0  |    |
|   |       |    | 4 | 140 | "  | "          | 78  | 2.0  |    |
| 4 | 26000 | 30 | 0 | 130 | 15 | Mi/P 70/30 | 100 | 1.0  | 15 |
|   |       |    | 2 | 130 | "  | "          | 40  | 1.3  |    |
|   |       |    | 4 | 120 | "  | "          | 27  | 1.1  |    |
| 5 | 175000| 30 | 0 | 120 | 15 | Mi/P 70/30 | 32  | 1.1  | 15 |
|   |       |    | 2 | 120 | "  | "          | 17  | 0.8  |    |
|   |       |    | 4 | 110 | "  | "          | 13  | 0.7  |    |
| 6 | 52000 | 40 | 0 | 120 | 15 | Mi 100     | 54  | 0.9  | 15 |
|   |       |    | 2 | 120 | "  | "          | 27  | 0.7  |    |
|   |       |    | 4 | 120 | "  | "          | 14  | 0.7  |    |
| 7 | 131000| 50 | 0 | 120 | 15 | Mi/P 70/30 | 39  | 0.5  | 15 |
|   |       |    | 2 | 120 | "  | "          | 16  | 0.6  |    |
|   |       |    | 4 | 90  | "  | "          | 10  | 0.6  |    |

*Mi = Methyl isobutyl ketone
P = 2-Propanol
**Contrast (gamma): $\gamma = 1/\log D_o/D_1$ Results:

The usual increase in sensitivity of the X-ray resist (by a factor of from 3 to 4) due to the addition of the modifier according to this invention is apparent from Table 2.

Comparable results are obtained when ethylene glycol dithioglycolate, pentaerythrito-β-mercaptocaproic ester, pentaerythritol-β-mercaptopropionic ester, 1,6-dimercaptohexane, or 1,9-dimercaptononane are used as organosulfur modifiers.

The contrast (gamma) factor (γ) may be used as a further criterion for evaluation. Referring to FIG. 1, the gamma factor is defined as follows:

$$\gamma = \frac{1}{\log \frac{D_1}{D_i}}$$

Where $D_i$ designates the intersection of the curve with the abscissa (log D) (that is to say, the radiation dose is so low that all the polymeric material dissolves), and $D_1$ is the projection to the abscissa of the intersection of the extrapolated, linear, initial portion of the curve with a line running parallel to the abscissa and passing through the point $d/d_o=1$ on the ordinate.

The contrast values determined for Examples 1 to 7 are listed in Table 2.

What is claimed is:

1. A radiation sensitive composition comprising (1) at least one organosulfur compound having at least two -SH groups per molecule and (2) a copolymer comprising methyl methacrylate and allyl methacrylate.

2. A radiation sensitive composition as in claim 1 wherein said organosulfur compound is present in a concentration from 0.5 to 15 percent by weight of the methyl methacrylate/allyl methacrylate copolymer.

3. A radiation sensitive composition as in claim 1 wherein allyl methacrylate is present in said copolymer in an amount from 10 to 60 percent by weight.

4. A radiation sensitive composition as in claim 1 which additionally comprises, as an adhesion promoting comonomer, a polymerizable compound having carboxyl, hydroxyl, and/or nitrogen-containing groups, said comonomer being present in an amount up to 0 to 5 percent by weight of the copolymer.

5. A radiation sensitive composition as in claim 1 wherein said copolymers comprising methyl methacrylate and allyl methcarylate have an average molecular weight between $10^4$ and $10^5$.

6. A radiation sensitive composition as in claim 1 wherein said copolymer has an average molecular weight ranging from 10,000 to 80,000.

7. A radiation sensitive composition as in claim 1 wherein the inhomogeneity of said copolymer does not exceed a value of 10.

8. A radiation sensitive composition as in claim 1 which has a sensitivity of at least 100 mJ/cm$^2$ and is sensitive to X-rays.

9. A radiation sensitive composition as in claim 1 wherein said copolymer additionally comprises an alkyl acrylate and/or alkyl methacrylate having from 1 to 7 carbon atoms in the alkyl groups in an amount up to 10 percent by weight of the copolymer.

10. A radiation sensitive composition as in claim 1 wherein said copolymer additionally comprises an ester of acrylic acid and/or of methacrylic acid with an aromatic alcohol or phenol in an amount up to 10 percent by weight of the copolymer.

11. A method for making a resist-coated substrate for recording by means of high energy radiation, which comprises applying to a substrate a solution comprising (1) at least one sulfur compound having at least two -SH groups per molecule and (2) a copolymer comprising methyl methacrylate and allyl methacrylate.

12. A method as in claim 11 wherein said solution additionally comprises from 10 to 20 percent of monomeric vinylcarbazole, whereby the polymer film is dry-developable in an oxygen plasma after exposure.

* * * * *